(12) United States Patent
Breuer et al.

(10) Patent No.: US 10,014,234 B2
(45) Date of Patent: Jul. 3, 2018

(54) SEMICONDUCTOR DEVICE COMPRISING A DIE SEAL INCLUDING LONG VIA LINES

(71) Applicant: GLOBALFOUNDRIES Inc., Grand Cayman (KY)

(72) Inventors: Dirk Breuer, Dresden (DE); Maik Liebau, Dresden (DE); Matthias Lehr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/367,888

(22) Filed: Dec. 2, 2016

(65) Prior Publication Data

US 2018/0158745 A1    Jun. 7, 2018

(51) Int. Cl.
| | | |
|---|---|---|
| H01L 23/00 | (2006.01) |
| H01L 23/26 | (2006.01) |
| H01L 23/31 | (2006.01) |
| H01L 23/522 | (2006.01) |
| H01L 23/528 | (2006.01) |
| H01L 21/56 | (2006.01) |
| H01L 21/66 | (2006.01) |
| H01L 21/768 | (2006.01) |

(52) U.S. Cl.
CPC .............. *H01L 23/26* (2013.01); *H01L 21/56* (2013.01); *H01L 21/76898* (2013.01); *H01L 22/12* (2013.01); *H01L 23/3107* (2013.01); *H01L 23/3142* (2013.01); *H01L 23/528* (2013.01); *H01L 23/5226* (2013.01); *H01L 23/562* (2013.01); *H01L 2224/4903* (2013.01); *H01L 2224/94* (2013.01)

(58) Field of Classification Search
CPC .............. H01L 23/562; H01L 2224/94; H01L 23/3107; H01L 2224/4903
See application file for complete search history.

(56) References Cited

U.S. PATENT DOCUMENTS

| | | | | |
|---|---|---|---|---|
| 8,283,193 | B2* | 10/2012 | Tan ........................ | H01L 23/562 438/115 |
| 9,455,232 | B2* | 9/2016 | Werner .................. | H01L 23/564 |
| 2004/0150070 | A1* | 8/2004 | Okada ..................... | H01L 22/32 257/508 |
| 2005/0098893 | A1* | 5/2005 | Tsutsue .................. | H01L 23/564 257/758 |
| 2009/0051011 | A1* | 2/2009 | Usami ............... | H01L 21/76811 257/620 |
| 2009/0108409 | A1* | 4/2009 | Tsutsue .................. | H01L 21/768 257/618 |
| 2010/0252828 | A1* | 10/2010 | Grillberger ............. | H01L 22/34 257/48 |

(Continued)

*Primary Examiner* — Ngan Ngo
(74) *Attorney, Agent, or Firm* — Amerson Law Firm, PLLC (57) ABSTRACT

The patterning technique used for forming sophisticated metallization systems of semiconductor devices may be monitored and evaluated more efficiently by incorporating at least one via line feature into the die seal. In this manner, high statistical significance may be obtained compared to conventional strategies, in which the respective test structures for evaluating patterning processes may be provided at specific sites in the frame region and/or die region. Moreover, by providing a "long" via line feature, superior sensitivity for variations of depth of focus may be achieved.

20 Claims, 6 Drawing Sheets

(56) References Cited

U.S. PATENT DOCUMENTS

| | | | |
|---|---|---|---|
| 2011/0156263 A1* | 6/2011 | Eto | H01L 23/585 |
| | | | 257/773 |
| 2011/0241178 A1* | 10/2011 | Miki | H01L 21/6836 |
| | | | 257/620 |
| 2011/0278722 A1* | 11/2011 | Miki | H01L 21/6836 |
| | | | 257/737 |
| 2012/0126228 A1* | 5/2012 | Fischer | H01L 23/585 |
| | | | 257/48 |
| 2015/0206934 A1* | 7/2015 | Funaya | H01L 22/34 |
| | | | 438/3 |
| 2015/0287684 A1* | 10/2015 | Ishiguro | H01L 23/585 |
| | | | 257/774 |
| 2016/0111381 A1* | 4/2016 | Werner | H01L 23/564 |
| | | | 257/48 |
| 2016/0181301 A1* | 6/2016 | Terada | H01L 27/1464 |
| | | | 257/228 |
| 2017/0162404 A1* | 6/2017 | Isobe | H01L 21/563 |
| 2017/0256638 A1* | 9/2017 | MacElwee | H01L 29/7787 |
| 2017/0271276 A1* | 9/2017 | Ho | H01L 23/562 |

\* cited by examiner

SEMICONDUCTOR DEVICE COMPRISING A DIE SEAL INCLUDING LONG VIA LINES

BACKGROUND

1. Field of the Disclosure

Generally, the present disclosure relates to the field of integrated circuits, and, more particularly, to die seal structures formed in the metallization system of semiconductor devices.

2. Description of the Related Art

Today's global market forces manufacturers of mass products to offer high quality products at a low price. It is thus important to improve yield and process efficiency to minimize production costs. This holds especially true in the field of semiconductor fabrication, since, here, it is essential to combine cutting-edge technology with mass production techniques. It is, therefore, the goal of semiconductor manufacturers to reduce the consumption of raw materials and consumables, while at the same time improving process tool utilization, since, in modern semiconductor facilities, equipment is required which is extremely cost intensive and represents the dominant part of the total product costs. Consequently, high tool utilization in combination with a high product yield, i.e., with a high ratio of good devices to faulty devices, results in increased profitability.

Integrated circuits are typically manufactured in automated or semi-automated facilities, where the products pass through a large number of process and metrology steps to complete the devices. The number and the type of process steps and metrology steps a semiconductor device has to go through depends on the specifics of the semiconductor device to be fabricated. A usual process flow for an integrated circuit may include a plurality of photolithography steps to image a circuit pattern for a specific device layer into a resist layer, which is subsequently patterned to form a resist mask used in further processes for forming device features in the device layer under consideration by, for example, etch, implantation, deposition, polish and anneal processes and the like. Thus, layer after layer, a plurality of process steps are performed based on a specific lithographic mask set for the various layers of the specified device. For instance, a sophisticated CPU requires several hundred process steps, each of which has to be carried out within specified process margins so as to fulfill the specifications for the device under consideration.

For these reasons, a plurality of measurement data is typically obtained for controlling the production processes, such as lithography processes and the like, which may be accomplished by providing dedicated test structures, which are typically positioned in an area outside of the actual die region, which is also referred to as frame region, which may be used for dicing the substrate when separating the individual die regions. During the complex manufacturing sequence for completing semiconductor devices, such as CPUs and the like, an immense amount of measurement data is created, for instance, by inspection tools and the like, due to the large number of complex manufacturing processes whose mutual dependencies may be difficult to assess so that usually factory targets are established for certain processes or sequences, wherein it is assumed that these target values may provide process windows so as to obtain a desired final electrical behavior of the completed devices. That is, the complex individual processes or related sequences may be monitored and controlled on the basis of respective inline measurement data such that the corresponding process results are held within the specified process margins, which in turn are determined on the basis of the final electrical performance of the product under consideration. Consequently, in view of enhanced overall process control and appropriate targeting the various processes on the basis of the final electrical performance, electrical measurement data is created on the basis of the dedicated test structures provided in the frame region. These electrical test structures may comprise appropriate circuit elements, such as transistors, conductive lines, capacitors and the like, which are appropriately connected to corresponding probe pads so as to allow dedicated measurement strategies for assessing electrical performance of the various critical elements in the test structure.

In sophisticated semiconductor devices, not only the circuit elements formed in and above a corresponding semiconductor layer require thorough monitoring, but also the metallization system of the semiconductor device is of high complexity, thereby also requiring sophisticated process and material monitoring techniques. Due to the ongoing shrinkage of critical dimensions of the semiconductor-based circuit features, such as transistors and the like, the device features in the metallization system also have to be continuously enhanced with respect to critical dimensions and electrical performance. For example, due to the increased packing density in the device level, the electrical connections of the circuit elements, such as the transistors and the like, require a plurality of stacked metallization layers, which may include metal lines and corresponding vias in order to provide the complex wiring system of the semiconductor device under consideration. Providing a moderately high number of stacked metallization layers is associated with a plurality of process related challenges, thereby requiring efficient monitoring and control strategies. For instance, in sophisticated applications, electrical performance in the metallization systems is typically increased by using dielectric materials having a low dielectric constant in combination with metals of high conductivity, such as copper, copper alloys and the like. Since the manufacturing process for forming metallization systems on the basis of dielectric materials of reduced permittivity, also referred to as low-k dielectrics, and highly conductive metals, such as copper, may include a plurality of very complex manufacturing steps, a continual verification of the process results is typically required in order to monitor the overall electrical performance of the metallization system and also performance of associated manufacturing strategies.

For example, the processing of copper material in a semiconductor manufacturing facility requires certain specifics with respect to obtaining metal lines and vias due to the specific characteristics of copper in view of material deposition, patterning the same and the like. That is, since copper may not be efficiently deposited on the basis of well-established chemical vapor deposition (CVD) processes and the like, and due to the fact that copper does not form volatile etch by-products for a plurality of well-established anisotropic etch recipes, typically a dielectric material is first deposited and patterned so as to include openings for the metal lines and vias, which are subsequently filled on the basis of a complex deposition regime, which may include the deposition of any appropriate conductive barrier material in combination with the copper bulk material that is applied on the basis of electrochemical deposition techniques. Thereafter, excess material created during the previous deposition sequence has to be removed, which is typically accomplished, at least at a certain phase of the removal process, by chemical mechanical polishing or planarization processes, thereby obtaining the desired electrically insulated metal lines that are embedded in the dielectric material. As previously indicated, the dimensions of the metal lines have to be reduced so as to comply with the increased desired packing density, thereby also requiring reduced spaces between the corresponding metal lines, which in turn necessitates the usage of low-k dielectric materials in order to maintain the parasitic RC (resistance capacitance) time constants at a desired low level, since typically signal propagation delay is significantly affected by the performance of the metallization system. Due to the complexity of the electrical connections to be provided in the metallization system, a plurality of metallization layers are stacked on top of each other, which may therefore require sophisticated lithography processes so as to form a corresponding etch mask for patterning the dielectric material of the metallization layer under consideration, followed by a complex deposition regime with a final removal process sequence, during which any excess material is removed and also the resulting surface topography is enhanced in order to allow a subsequent sophisticated lithography process for patterning the dielectric material of a subsequent metallization layer. For example, the process for forming vias, i.e., vertical contact elements extending from a metal line of one metallization layer to another metal line of a neighboring metallization layer, may involve a highly critical lithography process in combination with an etch process, while also the subsequent filling in of the conductive material, such as a thin conductive barrier material, possibly in combination with a seed material, may represent critical process steps and thus have a significant influence on the overall electrical performance of the metallization layer under consideration. Furthermore, many of these complex manufacturing processes, such as lithography, etching, polishing and the like, may depend on the local neighborhood within the die region of interest in terms of the resulting process output. That is to say, the etch behavior, the deposition behavior, the polishing behavior and the like may locally depend on the pattern density, i.e., the number and size of circuit features, such as metal lines and vias, provided in an appropriately selected unit area, so that certain process variations may occur with respect to device areas having a different pattern density. For example, the difference in the removal rate of device areas of moderately low pattern density, i.e., the number of device features, such as trenches, vias, gate electrodes and the like per unit area, may differ from the removal rate in areas of increased pattern density, thereby creating different height levels in device regions of significant different pattern density. The difference in height level, however, may negatively influence process results in lithography processes that are performed so as to define critical feature sizes in the corresponding device level. Since the lithography process represents the basis for obtaining critical dimensions of device features such as transistors, metal lines, vias and the like, a corresponding difference in the critical dimensions and thus the overall performance of these device features may occur.

It is well known that great efforts are being made to steadily improve the optical properties of the lithographic system, for example, in terms of numerical aperture, depth of focus and wavelength of the light source used. The resolution of an optical system is proportional to the wavelength of the light source used and to a process-related factor and is inversely proportional to the numerical aperture. For this reason, the wavelength may be reduced and/or the process-related factor may be reduced and/or the numerical aperture may be increased in an attempt to increase the overall resolution. In recent years, all three approaches have been concurrently taken, thereby resulting in highly complex lithography systems, in which the finally achieved resolution is well below the wavelength of the exposure radiation. On the other hand, the depth of focus, i.e., the range within which objects may be imaged with sufficient accuracy, is inversely proportional to the square of the numerical aperture so that recent developments in increasing the numerical aperture have resulted in a significantly reduced depth of focus, which may therefore have a significant influence on the performance of the imaging process, since corresponding topography variations may thus result in a significant modification of the final critical dimension, which in turn may lead to corresponding non-uniformities with respect to performance of, for instance, complex integrated circuits.

One source of creating significant differences in surface topography is the area between the actual die region and the frame region, in which typically a so-called die seal is provided so as to circumferentially delimit the actual die region from the frame region in which scribe lines are provided so as to dice the substrate when separating the individual semiconductor chips. During the dicing of the substrates, typically significant mechanical forces may act on the neighboring die regions, which may result in damage, for instance, within the complex metallization system. As discussed above, in sophisticated semiconductor devices, typically the metallization system may be formed on the basis of sophisticated dielectric materials having a dielectric constant of 3.0 and less which, however, may have a significantly reduced mechanical stability compared to well-established conventional dielectric materials, such as silicon dioxide, silicon nitride and the like. Thus, upon the dicing process, the significant mechanical forces may result in the formation of cracks, material delamination events and the like, which may result in even fatal failures of the metallization system and may also contribute to a significant additional contamination of the die regions. For this reason, the die seal is provided in the metallization system of the semiconductor device so as to connect to the semiconductor substrate and provide a robust mechanical barrier in which the mechanical forces may be accommodated without causing significant damage in the metallization system within the actual die region. Typically, the die seal region may be comprised of any appropriately shaped metal features, such as line portions, vias and the like, in each of the subsequent metallization layers so as to form a robust wall or barrier, as will be described in more detail with reference to FIGS. 1a-1c.

Figure 1A:
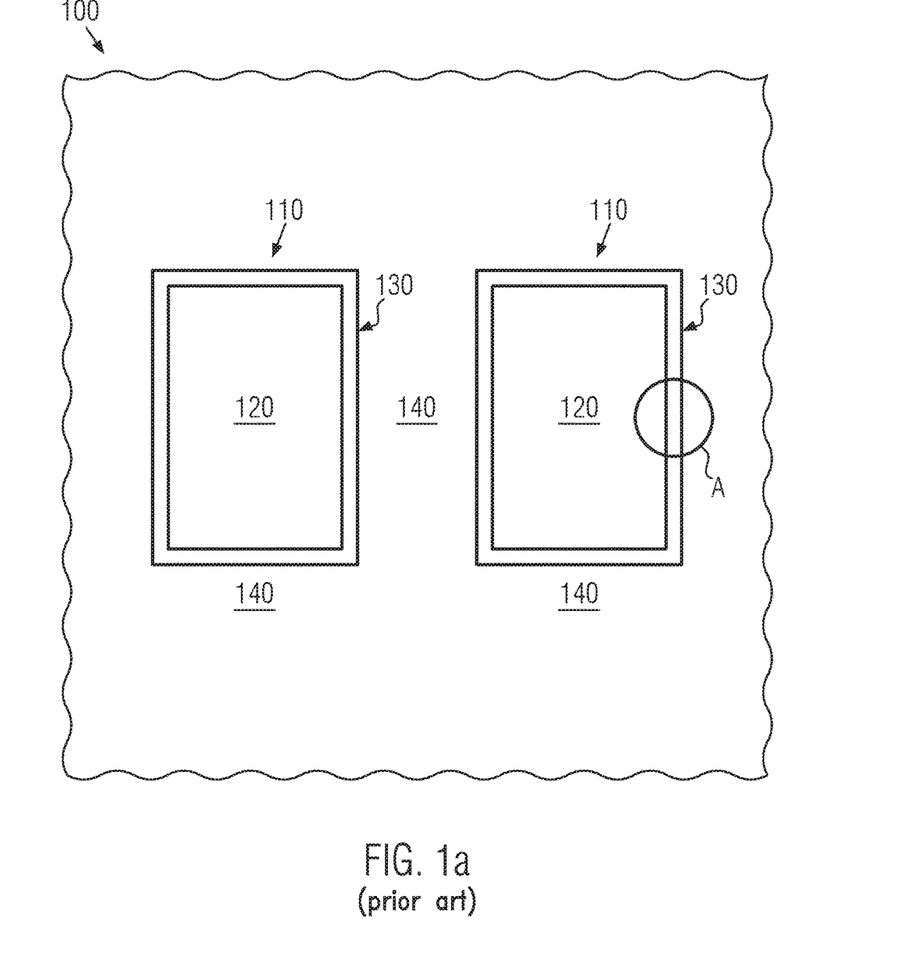
FIG. 1a schematically illustrates a top view of a semiconductor device comprising a semiconductor die including a die region that is laterally delineated by a die seal formed in a metallization system.

FIG. 1a schematically illustrates a top view of a semiconductor device 100 at any manufacturing stage prior to dicing the device 100. The device 100 may comprise a plurality of die 110, wherein, for convenience, two respective die 110 are illustrated in FIG. 1a. It should be appreciated, however, that a plurality of such semiconductor die 110 are provided as an array separated by a corresponding frame region 140 which, as previously noted, may be used for defining appropriate scribe lines and also for forming any test structures so as to not consume valuable chip area. The die 110 may have any appropriate geometric configuration, for instance, a square-like or rectangular layout, depending on the overall function of the die 110 and the respective circuits contained therein. The die 110 comprises an internal die region 120, which should be understood as any appropriate substrate material including one or more semiconductor layers and other device levels, such as a plurality of metallization layers, which may form the wiring network for actual circuit elements provided within the die regions 120. The die regions 120 may laterally be delimited by a die seal region 130, which is typically formed of a plurality of densely packed metal features provided in the metallization system in order to form a mechanically stable barrier. Therefore, the die seal regions 130 may extend through all of the metallization layers, i.e., in FIG. 1*a*, a direction perpendicular to the drawing plane, thereby possibly also connecting to a substrate material of the semiconductor device 100. Typically, the metal features may be formed as respective line segments extending between transversely arranged line segments, thereby forming a dense structure of electrically connected metal features, which may finally be connected to the semiconductor material or substrate in order to enhance the overall electrical robustness of any circuits formed in the die regions 120.

Figure 1B:
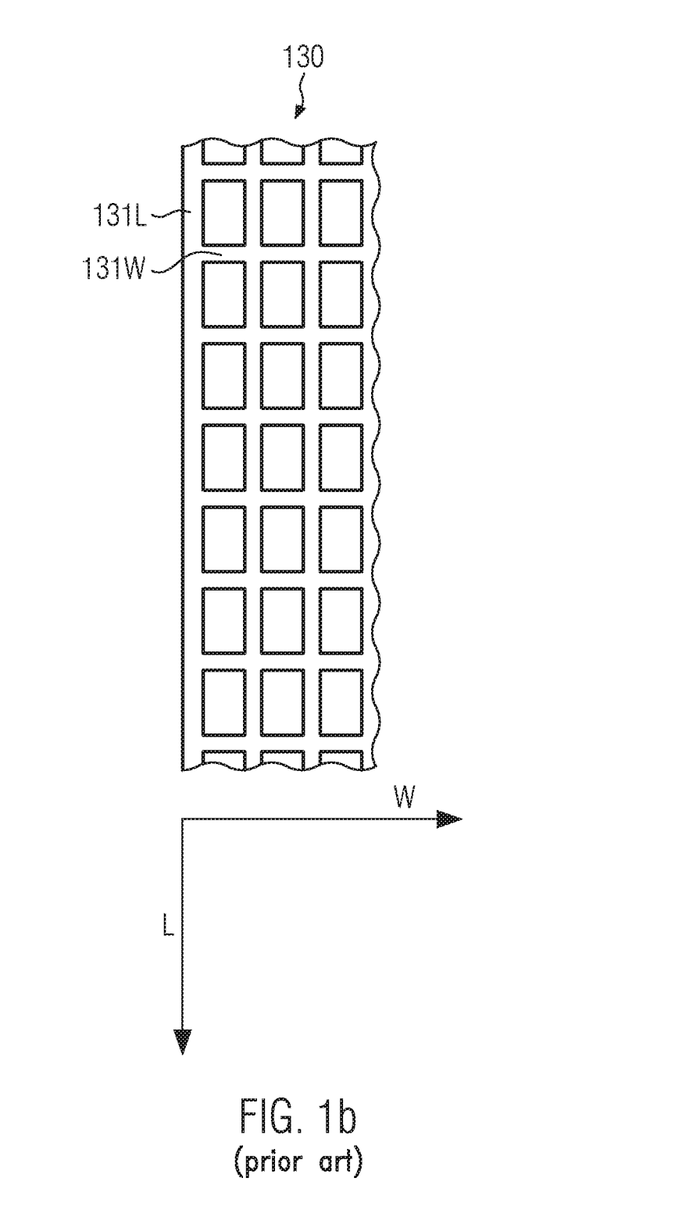
FIG. 1b schematically illustrates an enlarged top view of a portion of the semiconductor device, where a complex pattern of metal features of the die seal is illustrated so as to provide electrical and mechanical robustness.

FIG. 1*b* schematically illustrates a top view of a portion of the semiconductor device 100, which is indicated in FIG. 1*a* as portion A. As illustrated, the die seal 130 may comprise a plurality of metal features provided in the form of metal line segments 131L, 131W, which may extend along a first lateral direction, indicated as W, and a second lateral direction, indicated as L. Consequently, each respective line segment 131L is interrupted and, thus, connected to a respective line segment 131W extending in the respective orthogonal lateral direction. In this manner, a dense fabric of metal-containing features is obtained, which may provide the desired superior mechanical strength. As indicated above, the metal features 131W, 131L may be formed in sophisticated dielectric materials, such as low-k dielectric materials, which per se have a low mechanical stability. It should be appreciated that the layout shown in FIG. 1*b* is of illustrative nature only and may represent the layout of a specific metallization layer, while the layout of an underlying layer may differ therefrom and may appropriately be connected to neighboring metallization layers on the basis of trenches, vias and the like. Typically, an extension of the die seal 130 along the lateral direction W may range between five 5-25 µm and even more, depending on the specific requirements of the semiconductor device under consideration. That is, the stability of the metallization system as a whole may significantly depend on the number of metallization layers and the materials used therein, and therefore the width of the die seal 130 may be selected so as to reduce the probability of damaging the die regions 120 upon dicing the substrate. For example, generally, a reduced thickness of the die seal 130 may result in a reduced mechanical stability so that, for many sophisticated semiconductor devices requiring a plurality of stacked metallization layers, for instance, three metallization layers and more, one of the basis of low-k dielectrics, a width of less than approximately 3 µm may be less than desirable. On the other hand, a width that is greater than approximately 20 µm may result in undue consumption of area of the substrates.

Figure 1C:
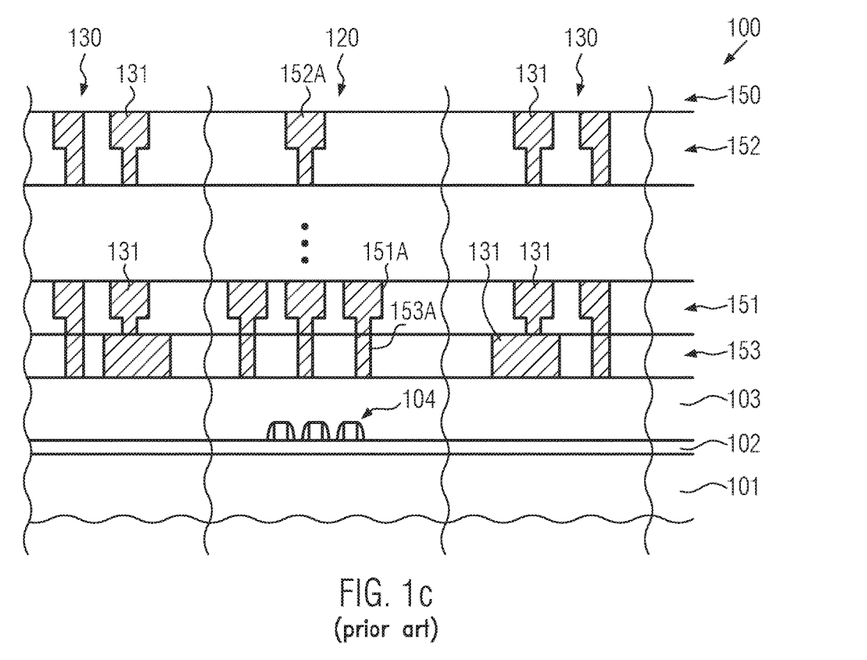
FIG. 1c schematically illustrates a cross-sectional view of the semiconductor device in the die region and the die seal, wherein the respective line elements of the die seal are formed together with metal features of a respective metallization layer according to conventional strategies.

FIG. 1*c* schematically illustrates a cross-sectional view of the semiconductor device 100, wherein a portion of the die region 120 and a portion of the die seal 130 are illustrated in a schematic manner. As shown, the device 100 comprises a substrate 101, such as a silicon substrate, an SOI (silicon-on-insulator) substrate, and the like. Any other semiconductor materials or dielectric materials may also be used as the substrate 101. A semiconductor layer 102, such as a silicon layer or any other appropriate semiconductor material, may be formed above the substrate 101, in and above which circuit elements 104 are provided, for instance, in the form of transistors and the like. As previously explained, in sophisticated applications, at least some of the circuit elements 104 may be formed on the basis of critical dimensions of 30 nm and less. The circuit elements 104 may be embedded in the dielectric material of a contact level 103, above which is provided a metallization system 150. The metallization system 150 comprises a plurality of metallization layers, wherein, for convenience, metallization layers 151, 152 and 153 are illustrated. In each of the metallization layers 151, 152, 153, corresponding metal features 151A, 152A, 153A are provided, for instance, in the form of metal lines, vias and the like. Thus, these metal features 151A, 152A, 153A may form the wiring network for any functional circuit portions provided within the die region 120.

In the die seal 130, respective metal features 131 are provided in accordance with any desired configuration so as to ensure a desired high metal density, wherein, as previously discussed, the basic layout of the metal features 131 may differ in the various metallization layers. An appropriate connection in between the individual metal layers may be accomplished within the die seal 130. As a consequence, the die seal 130 may at least extend through the metallization system 150 and may typically connect to the semiconductor layer 102 on the basis of appropriate contact elements that are provided in the contact level 103. For convenience, a respective contact regime for connecting to the semiconductor layer 102 is not shown.

Typically, the metallization system 150 may be formed on the basis of manufacturing techniques and material systems as explained above. Due to the dependence of many manufacturing processes on the local topography, a respective variation across the metallization features may be observed, in particular for die regions 120 positioned at the edge of the corresponding wafer or substrate, since typically in these regions the corresponding process uniformity, for instance layer deposition and the like, may be inferior, thereby contributing to a more or less pronounced surface topography. As discussed above, in particular, sophisticated lithography processes are highly sensitive to a variation of depth of focus, which may in particular be affected by the pronounced surface topography in critical device areas, such as die regions 120 positioned in the vicinity of the wafer edge. In order to appropriately monitor and control the highly complex patterning processes in particular for forming metal features in the respective metallization layers, respective vias, which proved to be particularly critical with respect to a variation of the patterning technique, may be formed in dedicated test structures, for instance provided in the frame regions 140 (see FIG. 1*a*), or test structures within the die regions 120, or actual vias may be used for optical inspection techniques in order to determine the quality of the respective patterning process. It turns out, however, that a variation of critical dimensions may be efficiently determined on the basis of vias in test structures and/or within the die region, however, with respect to determining variations in depth of focus these vias may have a reduced sensitivity caused by their compact lateral layout in the form of squares and/or rectangles.

Since a smooth formation of a sophisticated metallization system is an important aspect of the overall process flow for forming semiconductor devices, the present disclosure relates to semiconductor devices and methods in which patterning processes may be monitored and/or evaluated, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that appropriate test structures may be provided for evaluating the quality of patterning processes, in particular in the metallization system of a semiconductor device, wherein, however, undue area consumption may be avoided. To this end, it has been recognized that the die seal of a semiconductor device, which has to be provided anyway in order to enhance the overall mechanical and electrical robustness upon dicing the semiconductor device, may be used as an area for providing test structures. According to further illustrative aspects, the test structure may comprise a via line feature, i.e., an elongated metal feature, thereby increasing the sensitivity with respect to a variation of depth of focus of an associated lithography process used for forming the via line feature.

One illustrative method disclosed herein includes forming at least one via line feature spatially associated with a die seal structure for each of a plurality of die regions provided above the substrate of a semiconductor device, wherein a die seal structure surrounds a respective one of the die regions. The method further includes determining at least one characteristic of each of the at least one via line feature so as to evaluate, by using the at least one characteristic, a patterning quality of a process sequence used to pattern device features together with the at least one via line feature.

One illustrative semiconductor device disclosed herein includes a semiconductor layer formed above a substrate and comprising a plurality of circuit elements. The semiconductor device further includes a metallization system formed above the semiconductor layer, wherein the metallization system includes a plurality of metallization layers. Additionally, a die seal is formed at least in the metallization system and delimits a die region, wherein the die seal includes a plurality of line segments extending between respective transverse line segments in each of the plurality of metallization layers. Furthermore, the die seal includes a via line feature, whose length is greater than a length of each of the plurality of line segments.

A further illustrative semiconductor device disclosed herein includes a metallization system formed above a substrate. Furthermore, the semiconductor device includes a die seal formed in the metallization system that laterally delimits a die region, wherein the die seal includes a via line feature with one or more first portions having a first width dimension and one or more second portions having a second width dimension that is less than the first width dimension.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

According to the present disclosure, it has been recognized that a space efficient strategy inspection strategy may be implemented in order to obtain measurement data with respect to evaluating the quality of patterning techniques used for forming complex metallization systems of semiconductor devices. As discussed above, a die seal is typically required in sophisticated semiconductor devices so as to provide electrical and mechanical robustness, in particular upon dicing and separating the individual die regions. Since, typically, the die seal regions have a pronounced surface topography due to the incorporation of a high density of metal features, a relatively challenging surface topography may be present in or in the vicinity of the die seal. By incorporating or at least associating a respective test structure in or with the die seal, measurement data may be obtained for each individual die region without compromising the ability of positioning a desired number of die regions above a given substrate. As a consequence, by using the die seal or its immediate vicinity as sites for providing test structures for evaluating the quality of patterning processes to be applied in the respective metallization layers, measurement data with appropriately high statistics may be gathered, thereby contributing to superior process monitoring and controlling.

In further illustrative embodiments, the test structure may be implemented on the basis of at least one via line feature, i.e., a metal feature, formed on the basis of target dimensions that correspond to respective target dimensions in one lateral direction for actual via features in the die region. The elongated configuration of these via line features may basically result in superior sensitivity with respect to variations of depth of focus. Consequently, an increased amount of inspection data may be obtained with high statistical significance due to the high number of possible inspection sites, wherein the geometry of a relatively long via line may additionally provide superior response to variations of depth of focus, thereby even more efficiently contributing to superior monitoring and controlling strategies for the respective lithography and/or etch processes.

In further illustrative embodiments, the via line feature may comprise at least one portion of reduced width compared to the target width used for patterning actual vias in the die region, thereby increasing the sensitivity for any process weaknesses or insufficiencies of the lithography/etch sequence used for patterning the actual via features in the die region. That is, by applying a reduced "critical dimension," the respective patterning processes may be more efficiently evaluated, since the reduced "critical dimension" may more efficiently reveal the limitations of the underlying patterning technique.

In further illustrative embodiments, in addition or alternatively to one or more portions of a reduced width, the via line may also comprise one or more portions of increased width, i.e., the width may be defined on the basis of a "critical via dimension" that is selected to be greater than the standard critical dimension for the respective metallization layer. In this manner, in particular the quality of a corresponding etch sequence may be evaluated more efficiently, since the dependency from the lithography process may be reduced due to significantly less sophisticated conditions when forming the respective one or more portions of the via line having the increased critical dimension. Therefore, substantially the etch process or etch sequence is considered responsible for any deviations, such as material residues and the like, thereby enabling a very efficient evaluation of the etch process.

In some illustrative embodiments, a plurality of parallel via line features may be provided in or in the vicinity of the die seal, thereby providing for different patterning conditions, as may be considered appropriate for evaluating the situation in the die regions. For example, a plurality of via line features may be provided with different lateral distance in order to appropriately simulate isolated line features and densely packed line features. To this end, the one or more via line features may be provided with different distance at different portions of the die seal or, for a given transverse extension of the one or more via line features, the number thereof may be varied so that, at least at certain areas, a reduced number of via line features may be provided, however, on the basis of an increased spacing between the individual via lines. For example, even a single via line feature may be provided, at least in some areas of the die seal, thereby efficiently simulating the patterning situation of isolated device features.

Moreover, in some illustrative embodiments, respective inspection data may be obtained at various stages of the patterning process for forming the die seal in a respective metallization layer, for instance, in a stage in which a patterned resist mask has been provided, the characteristics of which may be efficiently determined, for instance, on the basis of scatterometry and the like, in order to evaluate the quality of the lithography process. It is well known that scatterometry techniques may allow the concurrent detection of various characteristics, such as layer thickness, sidewall angle of patterned features and the like, for example, in a resist material, thereby providing superior statistics of the inspection data. In other illustrative embodiments, a respective gathering of inspection data may be accomplished on the basis of the patterned dielectric material of the metallization layer under consideration, for instance, with respect to material residues, sidewall angles, depth of patterned features and the like, thereby allowing an efficient evaluation of the combined lithography/etch sequence. Furthermore, as already discussed above, by varying the width of one or more portions of the via line features, the respective sensitivity may be adjusted in order to specifically evaluate an etch process.

With reference to FIGS. 2a-2e, further illustrative embodiments will now be described in more detail, wherein reference is also made to FIGS. 1a-1c.

Figure 2A:
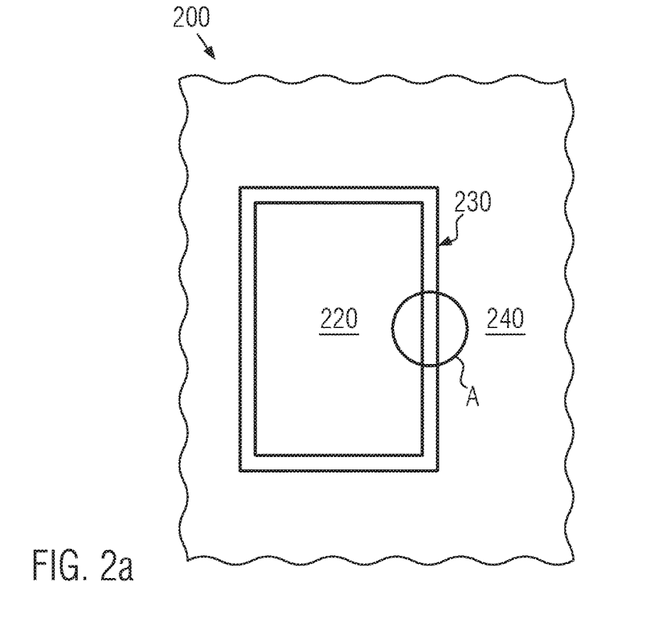
FIG. 2a schematically illustrates a top view of a semiconductor device with a die seal including long via line features used for determining the quality of patterning sequences according to illustrative embodiments.

FIG. 2a schematically illustrates a top view of a semiconductor device 200 that may comprise a die region 220 surrounded by a die seal 230, as also previously discussed. It should be appreciated that the device 200 is illustrated prior to dicing a corresponding substrate, which may typically include a plurality of die regions 220, as also discussed above with reference to the device 100. Consequently, the die region 220 in combination with the die seal 230 may comprise a metallization system including a plurality of metallization layers, as also previously discussed with reference to the device 100. Contrary to the conventional device 100, the die seal 230 may include an appropriate test structure based on at least one "long" via line feature, which may, therefore, provide a highly efficient evaluation of lithography/etch processes, in particular with respect to a variation of depth of focus, as also discussed above.

Figure 2B:
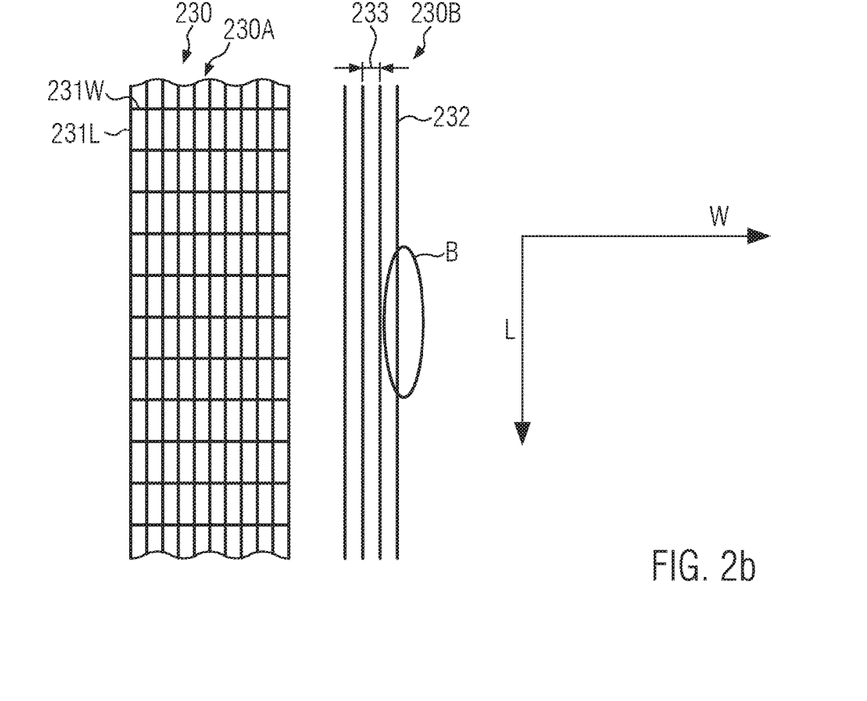
FIG. 2b schematically illustrates a top view of a portion A indicated in FIG. 2a, thereby illustrating a plurality of long via lines in combination with standard metal features of a die seal according to illustrative embodiments.

FIG. 2b schematically illustrates a top view of the portion A indicated in FIG. 2a. As illustrated, the die seal 230 may comprise a "conventional" portion 230A, which may include respective metal features, such as line segments 231W, 231L, which may extend along a first lateral direction W and a second lateral direction L, respectively. As also discussed above with reference to the device 100, the line segments 231W, 231L may represent respective line features, which may extend along a respective lateral direction, which, however, may periodically be interrupted by a respective line segment extending along the corresponding orthogonal lateral direction. That is, the length of the respective line segments 231W, 231L is defined as the corresponding length of a portion extending between the respective intersections with line segments crossing in the orthogonal lateral direction. Therefore, the line segments 231W, 231L may be less appropriate for being used as test structures. As previously discussed, the structure of the metal features of the portion 230A is primarily designed so as to obtain the desired mechanical strength and provide the electrical connection between the individual metal features in one metallization layer and electrical connection to neighboring metallization layers provided above and below a respective metallization layer under consideration.

Moreover, the die seal 230 may comprise a second portion 230B, which may be considered as a test structure and which may comprise at least one "long" via line feature 232, which may be considered as "long" in the sense that an extension thereof in the corresponding lateral direction, in FIG. 2b the direction L, may be greater than any of the lengths of the line segments 231W, 231L. In illustrative embodiments, a length of each of the via line features 232 is at least 10 times the length of each of the respective line segments 231W, 231L in the portion 230A. Consequently, superior sensitivity to variations of depth of focus may be obtained due to the relatively long extension in the length direction of the via line features 232. On the other hand, the width of the via line features 232 may be formed so as to correspond to at least one target dimension, as may also be used in forming actual device features in the die region 220 (see FIG. 2a).

As discussed above, in illustrative embodiments, at least one further width dimension may be implemented that deviates from the respective target dimension in order to specifically adjust sensitivity of the via line. In still other illustrative embodiments, as will also be discussed below, at least a third different width dimension may be implemented in at least one of the via line features 232, thereby obtaining superior overall sensitivity with respect to various characteristics of a respective patterning sequence including lithography and one or more etch processes. Furthermore, as discussed above, although four via line features 232 are illustrated so as to extend substantially parallel to each other in the length direction, i.e., in this portion of the die seal along the lateral direction L, any number of parallel via line features may be provided, for instance a single via line feature, at least in certain areas of the die seal 230, two or more via line features, or five via line features or more may be provided. Additionally, a spacing 233 may be selected in accordance with the overall inspection strategy. For example, the spacing 233 for a given overall extension in the lateral direction of the die seal, in this case the lateral direction W, may be selected, at least in specific sections of the portion 230B, so as to meet the requirements with respect to covering relevant device architectures encountered in the die region 220 (see FIG. 2a). In other cases, at least in some sections, the number of via line features 232 may be reduced or increased in order to vary the spacing 233 for a given overall lateral extension of the portion 230B. It should also be appreciated that the spacing 233 for a plurality of parallel via line features may be different for at least some of the via line features 232. It should be appreciated that, in illustrative embodiments, the at least one via line feature may be provided in both lateral directions W, L as well as in at least one corner portion of the die seal 230.

Figure 2C:
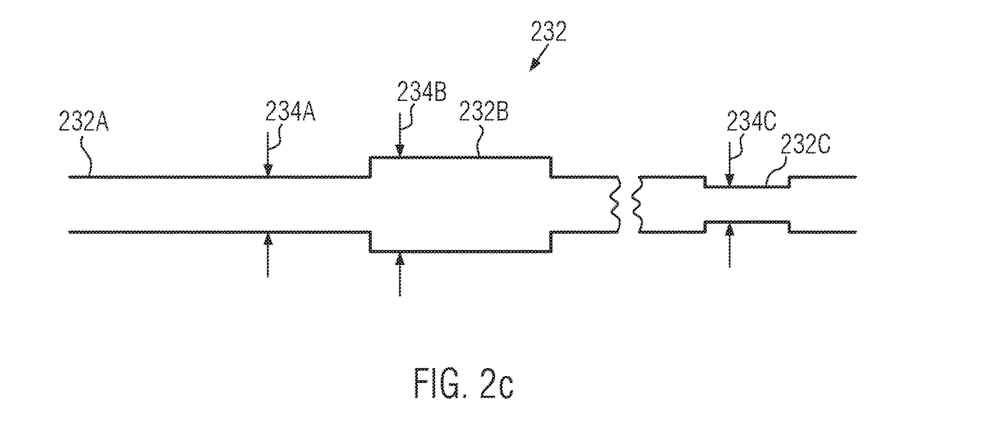
FIG. 2c schematically illustrates a top view of a via line feature provided in the die seal, wherein, in some illustrative embodiments, portions with different width may be provided so as to adjust the sensitivity for different types of patterning processes.

FIG. 2c schematically illustrates a top view of a portion of one of the via line features 232, indicated by the area B in FIG. 2b. As illustrated, in some illustrative embodiments, the via line feature 232 may comprise one or more line portions 232A formed on the basis of a width dimension 234A, which corresponds to a respective "critical via dimension" or target dimension that is also used for forming actual via features in the device region 220 (see FIG. 2a). Furthermore, the via line feature 232 may comprise one or more portions 232B having a width 234B that is implemented on the basis of a target dimension that is greater than the target dimension used for patterning the width 234A. Providing the portion 232B with increased width 234B may result in an increased sensitivity specifically to an etch process forming a respective cavity in the surrounding dielectric material, since, due to the less critical lithography conditions for forming the portion 232B, any process variations or insufficiencies may mainly be caused by the patterning process, thereby providing superior monitoring and controlling efficiency with respect to the respective etch process.

In addition or alternatively to the one or more portions 232B, one or more portions 232C may be provided, which may have a width 234C that may be implemented on the basis of a further target dimension that is less than the target dimension used for implementing the width 234A. In this case, the limits of a respective patterning sequence including lithography and one or more etch processes may be evaluated more efficiently due to the more sophisticated conditions upon forming the portion 232C having the reduced width 234C. As a consequence, in addition to varying the number and/or spacing of the via line features 232, at least some via line features may have incorporated therein different width dimensions based on different target dimensions, thereby providing the possibility of specifically adjusting the respective sensitivity upon performing a measurement or inspection process. Generally, irrespective of the number and type of portions of different width dimensions, a generally elongated geometry provides superior sensitivity to depth of focus variations, wherein the efficient incorporation of the one or more via line features 232 into the die seal 230 may provide the possibility of obtaining measurement data or inspection data from any of the die regions 220 (see FIG. 2a).

Figure 2D:
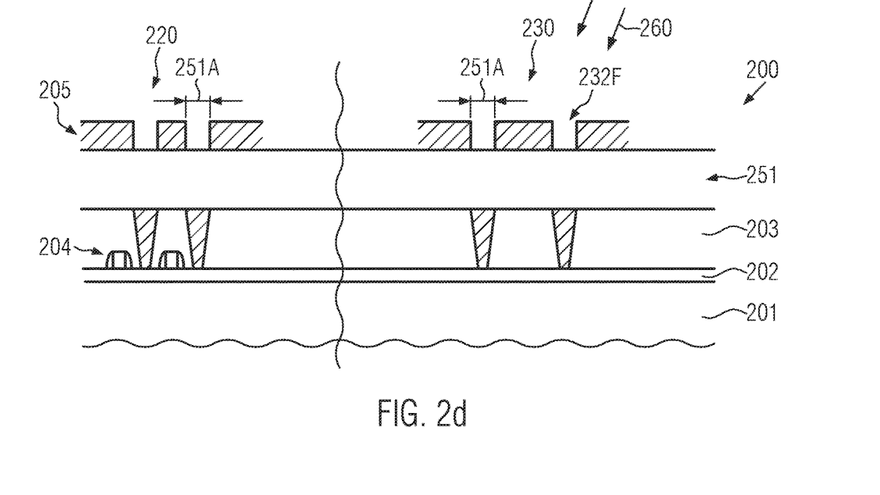
FIG. 2d schematically illustrates a cross-sectional view of the semiconductor device according to further illustrative embodiments, in which optical inspection techniques, such as scatterometry, electron microscopy and the like, may be used for determining the quality of a lithographic process on the basis of a patterned resist mask.

FIG. 2d schematically illustrates a cross-sectional view of the semiconductor device 200 in a corresponding manufacturing stage, in which circuit elements 204 may be formed in and above a semiconductor layer 202, which may be formed on a substrate 201.

Furthermore, a contact level 203 including a respective dielectric material may be provided so as to connect to a metallization layer 251 still to be completed. Regarding any process strategy for forming the semiconductor device 200 and regarding any process materials and the like, it may be referred to the semiconductor device 100, as discussed above. Thus, the dielectric material of the metallization layer 251 or at least a portion thereof may have to be patterned on the basis of sophisticated lithography/etch techniques, as discussed above. To this end, a resist layer 205 may be formed and may be patterned on the basis of lithography techniques, thereby obtaining a respective etch mask, i.e., the patterned layer 205. The patterning may be accomplished on the basis of a target dimension 251A, as, for instance, required for forming via features in the device region 220, wherein the same target dimension 251A may be used for forming at least specific portions of the via line features in the die seal 230.

In the illustrative embodiment shown in FIG. 2d, an inspection process 260 may be performed so as to evaluate at least one characteristic, such as layer thickness, depth of respective features in the etch mask 205, sidewall angle of respective resist features. To this end, any appropriate inspection techniques, such as scatterometry, electron microscopy and the like, may be applied. It should be appreciated that a corresponding resist feature 232F may basically correspond to the overall geometry of the via line features 232 (see FIGS. 2b, 2c), wherein, however, lithography specific characteristics may be reflected by the features 232F and may be detected by the inspection process 260. As a consequence, during the process 260, mainly lithography specific characteristics may be evaluated on the basis of the preliminary features 232F, wherein the inspection process 260 may be applied at any desired site of the device 200, since the features 232F are formed in each of the die seals 230 in each of the individual die regions. It should further be appreciated that the one or more via line features, for instance in their preliminary form 232F, may be provided at any relevant portions within the die seal 230, for instance along the two different lateral directions W, L (see FIG. 2b) and also in at least one, preferably in all, corner portions of the die seal 230.

Figure 2E:
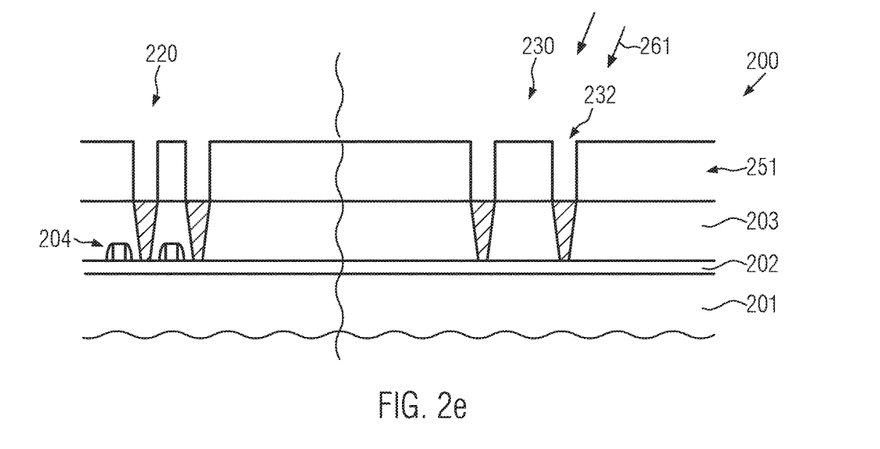
FIG. 2e schematically illustrates a cross-sectional view of the semiconductor device according to still further illustrative embodiments, in which inspection techniques may be applied to a patterned dielectric material of a respective metallization layer so as to assess the quality of a lithography process and/or an edge technique.

FIG. 2e schematically illustrates the semiconductor device 200 in a further advanced stage, in which the dielectric material of the metallization layer 251 may have been patterned on the basis of an appropriate etch strategy, which is to be used for forming the actual via features in the device region 220, thereby also forming the one or more via line features 232 in the die seal 230 together with the other line segments of the die seal 230, as previously described with reference to FIG. 2b. Also, in this stage, a further inspection process 261, such as an optical inspection process, electron microscopy and the like, may be applied so as to determine at least one characteristic of the via line features 232. As previously discussed, by implementing portions of different width, the sensitivity during the inspection process 261 may be specifically adjusted, for instance, with respect to an etch process and/or to a combination of a lithography/etch sequence. For example, during the inspection process 261, material residues, sidewall angles, depth of line features and the like may be determined as one or more characteristics of the via line features 232, thereby also allowing an efficient evaluation of the respective processes in the device region 220.

In other illustrative embodiments, the processing may be continued by filling the features in the layer 251 on the basis of any appropriate process strategy, as also discussed above, which may include the deposition of sophisticated materials, such as copper and the like, in combination with respective conductive and isolating barrier materials, followed by planarization techniques. Consequently, after completing a corresponding process sequence, substantially completed device features in combination with via line features may be obtained, which may also be subjected to one or more further inspection processes, thereby also providing the possibility of evaluating the entire process sequence for obtaining metal features. Thereafter, one or more further metallization layers may be formed, as, for instance, discussed in the context of the semiconductor device 100, and respective via line features may also be formed in the die seals of these further metallization layers. In this manner, any desired amount of inspection data may be gathered for any desired metallization layer, thereby providing efficient process monitoring and controlling.

In some embodiments, one or more of the via line features 232 may be provided as a continuous via line as a part of the die seal 230. Therefore, the one or more continuous line features 232 surround the die region 220 and provide superior integrity of the die region 220. For instance, superior protection against incorporation of moisture into the die region 220 may be achieved by providing at least one of the via line features 232 as a continuous line that surrounds the die region 220.

As a result, the present disclosure provides methods and devices in which a die seal may be efficiently used for incorporating a test structure including at least one "long" via line feature, thereby providing superior sensitivity with respect to depth of focus variations during the patterning of sophisticated metallization layers. It should be appreciated that, in some illustrative embodiments, the given width of a die seal may substantially correspond to a conventional width of a die seal, for instance, by reducing the width of the standard portion 230A (see FIG. 2b), while, in other cases, a lateral width may be increased by an appropriate amount, for instance in the range of 1-5 μm, depending on the overall configuration of the one or more via line features. It should be appreciated that the test structure comprising at least one via line feature may be considered as being a part of the die seal, even if a certain lateral distance between the standard portion 230A and the portion 230B may be established, as, for instance, shown in FIG. 2b. In some illustrative embodiments, the portion 230B may be electrically and mechanically connected to the standard portion 230A by respective line segments, if a corresponding electrical and mechanical connection is considered appropriate. In other cases, as illustrated in FIG. 2b, the one or more via line features may remain electrically insulated from the remaining die seal. Moreover, superior integrity of the die regions may be achieved by providing the at least one via line feature as a continuous line, thereby, for example, enhancing moisture protection of the die region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:

forming at least one via line feature spatially associated with a die seal structure for each of a plurality of die regions provided above a substrate of a semiconductor device, each die seal structure surrounding a respective one of said die regions, wherein said at least one via line feature has an axial length and comprises a first portion having a first target dimension connected to a second portion along said axial length, said second portion having a second target dimension different than said first target dimension; and determining at least one characteristic of said at least one via line feature so as to evaluate, by using said at least one characteristic, a patterning quality of a process sequence used to pattern device features together with said at least one via line feature.

2. The method of claim 1, wherein forming said device features in said process sequence comprises patterning said device features using said first target dimension.

3. The method of claim 1, wherein said second target dimension is less than said first target dimension.

4. The method of claim 3, wherein forming said at least one via line feature further comprises patterning a third portion of said at least one via line feature connected to said first portion or said second portion and having a third target dimension that is greater than said first target dimension.

5. The method of claim 1, wherein forming said at least one via line feature together with said device features comprises performing at least one lithography process so as to form an etch mask.

6. The method of claim 5, wherein determining said at least one characteristic comprises detecting at least one optical characteristic of said etch mask.

7. The method of claim 5, wherein forming said at least one via line feature further comprises performing at least one etch process by using said etch mask.

8. The method of claim 7, wherein determining said at least one characteristic comprises detecting at least one of a material residue, an actual transverse dimension and a sidewall angle of each of said at least one via line feature.

9. The method of claim 1, wherein forming said at least one via line feature further comprises forming two or more via line features that extend in parallel to each other.

10. The method of claim 1, wherein said at least one via line feature is formed in a first lateral direction, a second lateral direction and in at least one corner portion of said die area.

11. The method of claim 1, wherein said die seal comprises a plurality of line segments extending between respective transverse line segments and wherein a length dimension along said at least one via line feature is adjusted to be greater than a length dimension of each of said plurality of line segments of said die seal.

12. A method, comprising:

forming at least one via line feature spatially associated with a die seal structure for each of a plurality of die regions provided above a substrate of a semiconductor device, each die seal structure surrounding a respective one of said die regions, wherein said at least one via line feature has an axial length and comprises a first portion having a first target dimension connected to a second portion along said axial length, said second portion having a second target dimension different than said first target dimension; and determining at least one characteristic of said at least one via line feature so as to evaluate, by using said at least one characteristic, a patterning quality of a process sequence used to pattern device features having said first target dimension together with said at least one via line feature.

13. The method of claim 12, wherein said second target dimension is less than said first target dimension.

14. The method of claim 13, wherein forming said at least one via line feature further comprises patterning a third portion of said at least one via line feature connected to said first portion or said second portion and having a third target dimension that is greater than said first target dimension.

15. The method of claim 12, wherein forming said at least one via line feature together with said device features comprises performing at least one lithography process so as to form an etch mask.

16. The method of claim 15, wherein determining said at least one characteristic comprises detecting at least one optical characteristic of said etch mask.

17. The method of claim 15, wherein forming said at least one via line feature further comprises performing at least one etch process by using said etch mask, and determining said at least one characteristic comprises detecting at least one of a material residue, an actual transverse dimension and a sidewall angle of each of said at least one via line feature.

18. The method of claim 12, wherein forming said at least one via line feature further comprises forming two or more via line features that extend in parallel to each other.

19. The method of claim 12, wherein said at least one via line feature is formed in a first lateral direction, a second lateral direction and in at least one corner portion of said die area.

20. The method of claim 12, wherein said die seal comprises a plurality of line segments extending between respective transverse line segments and wherein a length dimension along said at least one via line feature is adjusted to be greater than a length dimension of each of said plurality of line segments of said die seal.

* * * * *